United States Patent
Nakajima

(10) Patent No.: US 6,493,860 B2
(45) Date of Patent: Dec. 10, 2002

(54) METHOD OF DESIGNING SEMICONDUCTOR DEVICE, AND METHOD OF MANUFACTURING SEMICONDUCTOR DEVICE

(75) Inventor: Kazuhiro Nakajima, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/894,405

(22) Filed: Jun. 28, 2001

(65) Prior Publication Data

US 2002/0002699 A1 Jan. 3, 2002

(30) Foreign Application Priority Data

Jun. 29, 2000 (JP) ......................................... 2000-196746

(51) Int. Cl.[7] ............................................... G06F 17/50
(52) U.S. Cl. ........................................... 716/13; 716/10
(58) Field of Search ........................................ 716/1–21

(56) References Cited

U.S. PATENT DOCUMENTS 6,118,937 A * 9/2000 Iwasaki ....................... 716/10
6,202,195 B1 * 3/2001 Tanaka et al. ................ 716/10
6,401,233 B1 * 6/2002 Suzuki et al. ................. 716/13

FOREIGN PATENT DOCUMENTS

| JP | 7-271836 | 10/1995 |
|----|----------|---------|
| JP | 10-092944 | 4/1998 |

* cited by examiner

*Primary Examiner*—Tuan T. Lam
*Assistant Examiner*—Quan Tra
(74) *Attorney, Agent, or Firm*—Choate, Hall & Stewart

(57) ABSTRACT

Methods of designing and manufacturing a semiconductor device are disclosed in order to reduce the manufacturing cost of the semiconductor device, and to easily realize a high-speed circuit by reducing wiring capacity. A maximum pitch of wiring of the wiring layers is determined under a condition that power consumption of the semiconductor chips at a predetermined operating frequency is equal to or less than a predetermined value, and the width and spacing of wiring of the wiring layers and the width of each contact for mounting the semiconductor chips are determined based on the determined wiring pitch the semiconductor device is manufactured by using a mask and a manufacturing process by which the determined pitch and width of wiring are realized.

8 Claims, 4 Drawing Sheets

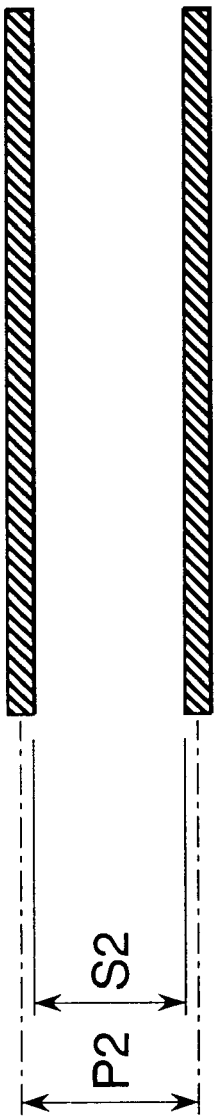

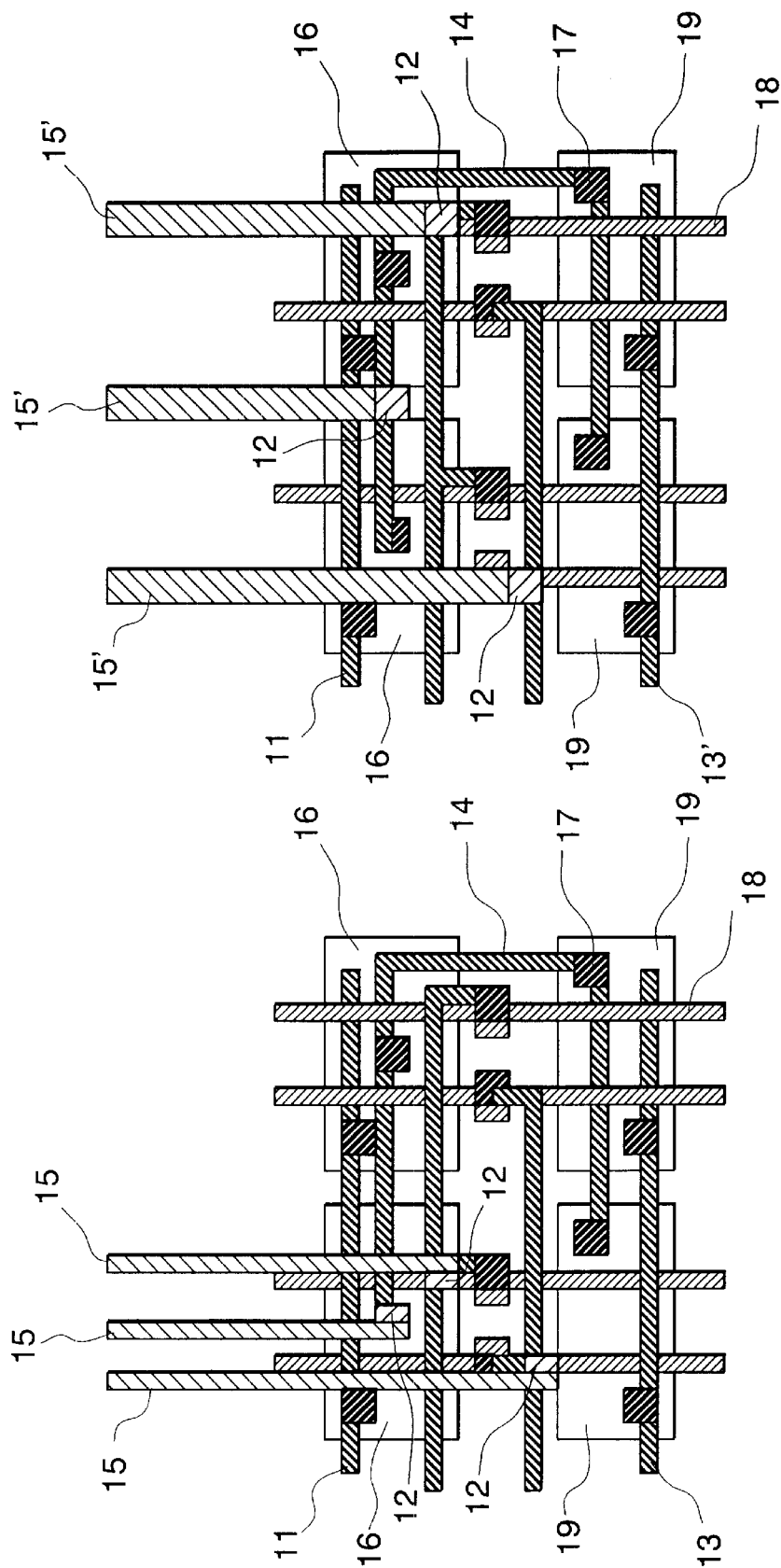

METHOD OF DESIGNING SEMICONDUCTOR DEVICE, AND METHOD OF MANUFACTURING SEMICONDUCTOR DEVICE

BACKGROUND OF THE INVENTION

1. Field of the Invention

The present invention relates to a method of designing a semiconductor device, and to a method of manufacturing a semiconductor device, and in particular, relates to methods for reducing the manufacturing cost of the semiconductor device.

2. Description of the Related Art

In conventional methods of designing and manufacturing a semiconductor device, reduction of the manufacturing cost of the semiconductor device has been an important objective.

In a conventional method for achieving this objective, a semiconductor device having a semiconductor chip which is as small as possible is designed under specific conditions defined by the relevant manufacturing process, such as the overall structure, and the pitch, width, and spacing of wiring (lines) of the semiconductor device, and then an appropriate mask is manufactured; a semiconductor device is then manufactured using the mask. This method has been put into practice.

However, in the above-described method, a process of producing a semiconductor chip and a process of forming wiring are integrated in a single process. Therefore, if a process of producing a semiconductor chip having a fine structure is used, then a process of forming fine, wiring is simultaneously employed.

If the density of wiring lines with respect to the semiconductor chip size is low, the layout of the semiconductor chip can be modified even when the modification of the pitch and width of wiring is considerable. However, even in such a case, a mask and a semiconductor device based on design rules employing small pitch and width of wiring are employed in the above conventional method.

The manufacturing cost necessary for using a mask and a semiconductor device which have small pitch and width of wiring is higher than that necessary for using a mask and a semiconductor device which have large pitch and width of wiring. Therefore, the above conventional method is not satisfactory in consideration of reduction of the manufacturing cost of the semiconductor device.

SUMMARY OF THE INVENTION

In consideration of the above circumstances, an object of the present invention is to provide a method of designing a semiconductor device and a method of manufacturing a semiconductor device, in order to reduce the manufacturing cost of the semiconductor device. Another object of the present invention is to provide a method of designing a semiconductor device and a method of manufacturing a semiconductor device, in order to easily realize a high-speed circuit by reducing wiring capacity (or capacitance).

Therefore, the present invention provides a method of designing a semiconductor device which includes at least semiconductor chips and wiring layers for connecting the semiconductor chips, comprising the step of:

determining a maximum pitch of wiring of the wiring layers under a condition that power consumption of the semiconductor chips at a predetermined operating frequency is equal to or less than a predetermined value.

The above method may further comprise the step of determining the width and spacing of wiring of the wiring layers and the width of each contact for mounting the semiconductor chips, based on the determined pitch of wiring of the wiring layers.

In addition, the above method may further comprise the step of selecting one or more of the wiring layers under a predetermined condition. In this case, in the step of determining a maximum pitch of wiring of the wiring layers, the pitch of wiring of only the selected wiring layers is maximized under the condition that power consumption of the semiconductor chips at a predetermined operating frequency is equal to or less than a predetermined value.

The present invention also provides a method of manufacturing a semiconductor device which includes at least semiconductor chips and wiring layers for connecting the semiconductor chips, comprising the steps of:

determining a maximum pitch of wiring of the wiring layers under a condition that power consumption of the semiconductor chips at a predetermined operating frequency is equal to or less than a predetermined value;

determining the width and spacing of wiring of the wiring layers and the width of each contact for mounting the semiconductor chips, based on the determined pitch of wiring of the wiring layers; and manufacturing the semiconductor device by using a mask and a manufacturing process by which the determined pitch and width of wiring are realized.

This method of manufacturing a semiconductor device may further comprise the step of selecting one or more of the wiring layers under a predetermined condition. In this case, in the step of determining a maximum pitch of wiring of the wiring layers, the pitch of wiring of only the selected wiring layers is maximized under the condition that power consumption of the semiconductor chips at a predetermined operating frequency is equal to or less than a predetermined value.

In addition, the method of manufacturing a semiconductor device may further comprise the step of selecting a mask and a manufacturing process under a predetermined condition among masks and manufacturing processes for realizing the determined pitch and width of wiring. In this case, in the step of manufacturing the semiconductor device, the semiconductor device is manufactured by using the selected mask and manufacturing process.

According to the present invention, a maximum pitch of wiring of the wiring layers is determined under the condition that power consumption of the semiconductor chips at a predetermined operating frequency is equal to or less than a predetermined value. Therefore, a semiconductor device is manufactured, not by using an unnecessarily fine mask and manufacturing process, but by using a mask and manufacturing process which is determined based on relaxed design rules and has a lower manufacturing cost, thereby reducing the manufacturing cost of the semiconductor device.

In addition, by enlarging the pitch of wiring, the capacity between wiring lines can be reduced, thereby increasing the circuit speed and reducing crosstalk noise.

BRIEF DESCRIPTION OF THE DRAWINGS

FIG. 2A shows a layout of a semiconductor device before the pitch of wiring is considerably enlarged, while FIG. 2B shows the layout of the semiconductor device after the pitch of wiring is considerably enlarged.

FIGS. 3A and 3B are diagrams for explaining the effects obtained by the method of designing and manufacturing a semiconductor device as shown in FIG. 1.

FIGS. 4A and 4B are diagrams showing layouts for explaining the second embodiment of the methods of designing and manufacturing a semiconductor device according to the present invention: FIG. 4A shows a layout of a semiconductor device before the pitch of wiring is considerably enlarged, while FIG. 4B shows the layout of the semiconductor device after the pitch of wiring is considerably enlarged.

DESCRIPTION OF THE PREFERRED EMBODIMENTS

Hereinafter, embodiments according to the present invention will be explained in detail with reference to the drawings.

Figure 1:
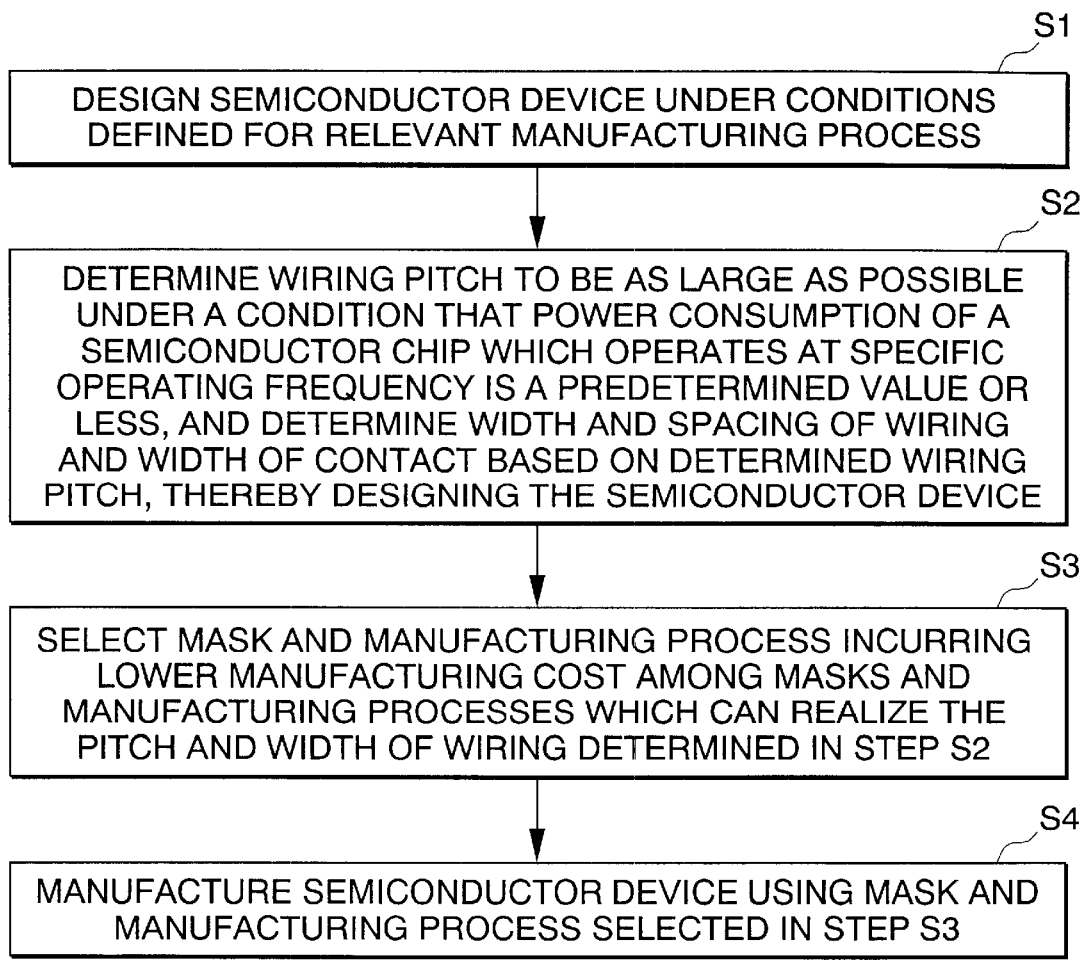
FIG. 1 is a flowchart for explaining the methods of designing and manufacturing a semiconductor device according to the present invention.

FIG. 1 is a flowchart for explaining the methods of designing and manufacturing a semiconductor device according to the present invention.

In the first step S1, a semiconductor device having a semiconductor chip which is as small as possible is designed under conditions, defined for a specific manufacturing process, such as the structure of the semiconductor device, and the pitch, width, and spacing of wiring of the semiconductor device.

In the next step S2, the pitch of wiring is determined to be as large as possible under the condition that the power consumption of the semiconductor chip which operates at a specific operating frequency will be equal to or less than a predetermined value. For example, for a given operating frequency of 100 MHz, the predetermined power consumption is 100 mW. Based on the determined pitch of wiring, the width and spacing of wiring and the width of each contact are determined, thereby designing a semiconductor device.

In the following step S3, among possible masks and manufacturing processes for realizing the pitch and width of wiring determined in step S2, a mask and a manufacturing process which incur a lower manufacturing cost are selected.

In the last step S4, a semiconductor device is manufactured using a mask and manufacturing process selected in step S3.

As explained above, in the present invention, the pitch of wiring is determined to have a maximum value under the condition that power consumption of a relevant semiconductor chip at a predetermined operating frequency is equal to or less than a predetermined value. Therefore, a semiconductor device is manufactured, not by using an unnecessarily fine mask and manufacturing process, but by using a mask and manufacturing process which is determined based on relaxed design rules and has a lower manufacturing cost, thereby reducing the manufacturing cost of the semiconductor device.

If a plurality of pitches of wiring are modified, preferably, they are equal insofar as is possible.

First Embodiment

Figure 2A:
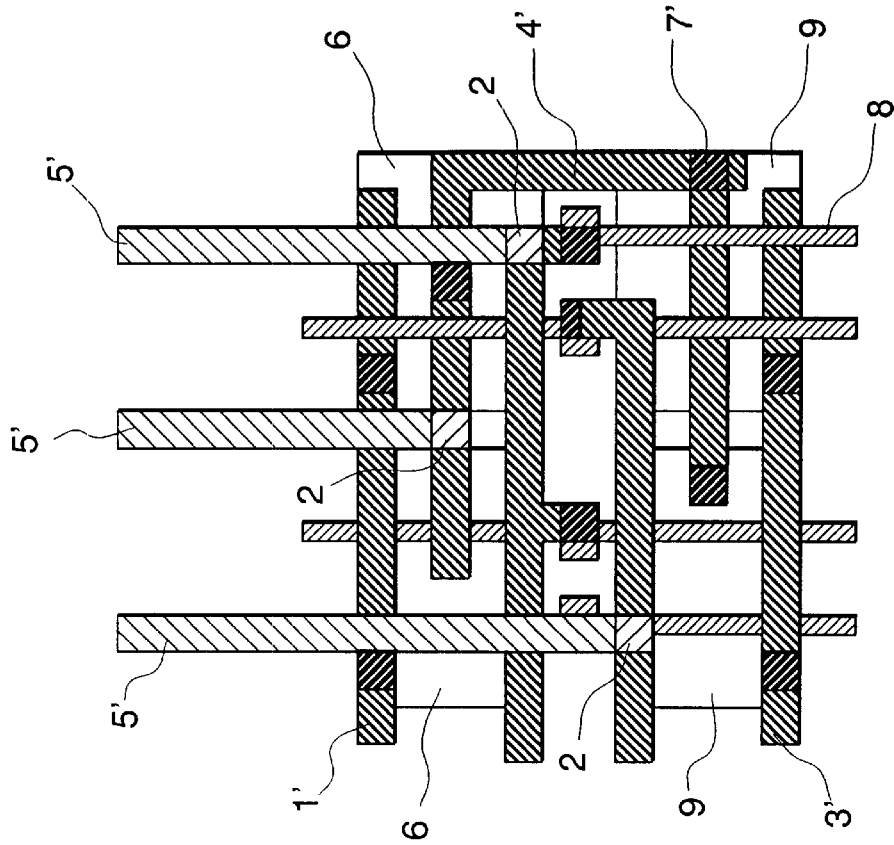
FIGS. 2A and 2B are diagrams showing layouts for explaining the first embodiment of the methods of designing and manufacturing a semiconductor device according to the present invention.
Figure 2B:
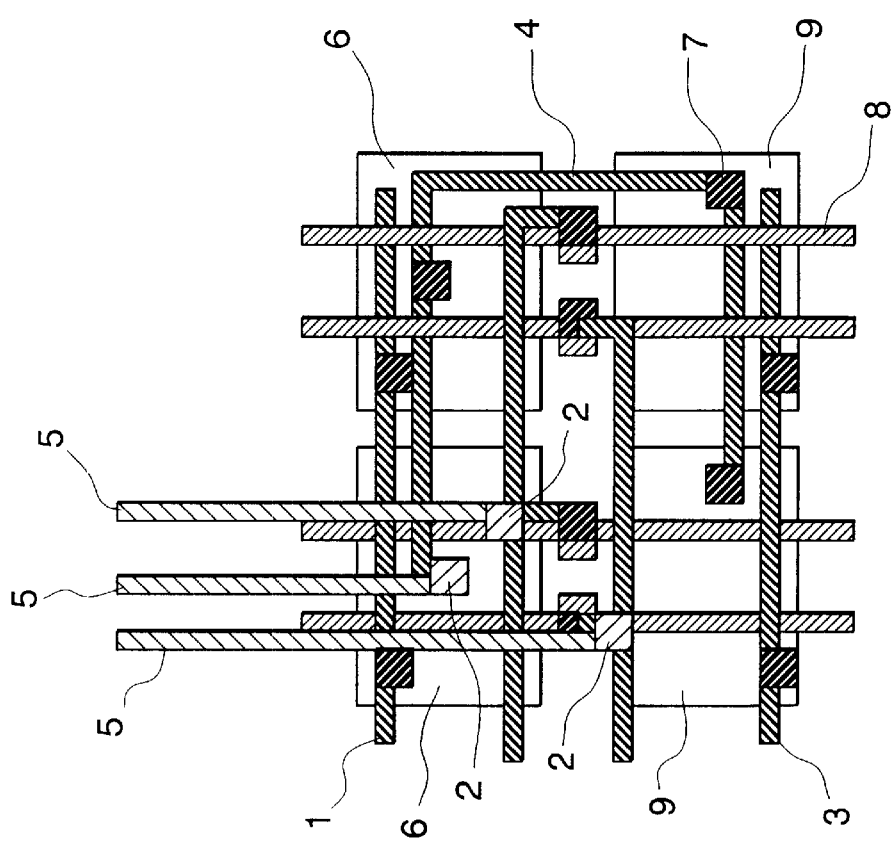

FIGS. 2A and 2B are diagrams showing layouts for explaining the first embodiment of the methods of designing and manufacturing a semiconductor device according to the present invention. FIG. 2A shows a layout of a semiconductor device before the pitch of wiring is considerably enlarged, while FIG. 2B shows the layout of the semiconductor device after the pitch of wiring is considerably enlarged.

First, a semiconductor device having a layout as shown in FIG. 2A is designed, under conditions defined in a specific manufacturing process, such as the structure of the semiconductor device, the pitch, width, and spacing of wiring, and the width of each contact for mounting a semiconductor chip.

In FIG. 2A, reference numeral 1 indicates a first metal wiring power-supply (VDD) line, reference numeral 2 indicates a first through hole, reference numeral 3 indicates a first metal wiring ground (GND) line, reference numeral 4 indicates a first metal wiring signal line, reference numeral 5 indicates a second metal wiring signal line, reference numeral 6 indicates a P-channel diffused layer, reference numeral 7 indicates a contact, reference numeral 8 indicates a gate (made of polysilicon), and reference numeral 9 indicates an N-channel diffused layer.

As for the first metal wiring signal, VDD, and GND lines belonging to the first metal wiring layer and the second metal wiring signal lines belong to the second metal wiring layer, the process of step S2 in FIG. 1 is executed, and the pitch of the relevant wiring is made as large as possible under the condition that the power consumption of the relevant semiconductor chip operating at a specific operating frequency will be equal to or less than a predetermined value.

Next, as for this considerably modified pitch of wiring, the width and spacing of wiring, and the width of each contact are determined. Here, the pitch has been enlarged, so that the width and spacing of wiring are also enlarged.

A semiconductor device having a layout as shown in FIG. 2B is then designed using the determined pitch, width, and spacing of wiring, and the determined width of each contact.

In FIG. 2B, reference numeral 1' indicates a first metal wiring VDD line, reference numeral 2 indicates a first through hole, reference numeral 3' indicates a first metal wiring GND line, reference numeral 4' indicates a first metal wiring signal line, reference numeral 5' indicates a second metal wiring signal line, reference numeral 6 indicates a P-channel diffused layer, reference numeral 7' indicates a contact, reference numeral 8 indicates a gate (made of polysilicon), and reference numeral 9 indicates an N-channel diffused layer. Here, each reference numeral marked with a prime mark indicates a modified portion.

Here, in order to manufacture a semiconductor device based on a layout as shown in FIG. 2A in which the pitch and width of wiring is small, a mask having a fine structure and a manufacturing process suitable for such a fine structure are necessary.

In contrast, in order to manufacture a semiconductor device based on a layout as shown in FIG. 2B in which the pitch and width of wiring is enlarged in comparison with FIG. 2A, a mask and a manufacturing process based on relaxed design rules in comparison with those suitable for the layout shown in FIG. 2A can be used.

The manufacturing cost necessary for manufacturing a semiconductor device using a fine mask and a corresponding manufacturing process is higher than the cost necessary for manufacturing a semiconductor device using a mask which is not fine and an appropriate manufacturing process. Therefore, the manufacturing cost of manufacturing the semiconductor device having an enlarged pitch of wiring as shown in FIG. 2B can be reduced in comparison with the manufacturing cost of manufacturing the semiconductor device relating to FIG. 2A.

FIGS. 3A and 3B are diagrams for explaining the effects obtained by the method of designing and manufacturing a semiconductor device as shown in FIG. 1. FIG. 3A shows metal wiring lines having smaller pitch P1 and spacing S1 of wiring, while FIG. 3B shows metal wiring lines having larger pitch P2 and spacing S2 of wiring. In the case of FIG. 3A, capacity (or capacitance) between wiring lines is large due to the smaller pitch and spacing, while in the case of FIG. 3B, capacity between wiring lines is small due to the larger pitch and spacing. Therefore, according to the present invention for enlarging the wiring pitch (i.e., the pitch of wiring), the capacity between wiring lines can be reduced, thereby increasing the circuit speed and reducing crosstalk noise.

Second Embodiment

FIGS. 4A and 4B are diagrams showing layouts for explaining the second embodiment of the methods of designing and manufacturing a semiconductor device according to the present invention. FIG. 4A shows a layout of a semiconductor device before the pitch of wiring is considerably enlarged, while FIG. 4B shows the layout of the semiconductor device after the pitch of wiring is considerably enlarged.

In FIG. 4A, reference numeral 11 indicates a first metal wiring VDD line, reference numeral 12 indicates a first through hole, reference numeral 13 indicates a first metal wiring GND line, reference numeral 14 indicates a first metal wiring signal line, reference numeral 15 indicates a second metal wiring signal line, reference numeral 16 indicates a P-channel diffused layer, reference numeral 17 indicates a contact, reference numeral 18 indicates a gate (made of polysilicon), and reference numeral 19 indicates an N-channel diffused layer.

In FIG. 4B, reference numeral 11 indicates a first metal wiring VDD line, reference numeral 12 indicates a first through hole, reference numeral 13 indicates a first metal wiring GND line, reference numeral 14 indicates a first metal wiring signal line, reference numeral 15' indicates a second metal wiring signal line, reference numeral 16 indicates a P-channel diffused layer, reference numeral 17 indicates a contact, reference numeral 18 indicates a gate (made of polysilicon), and reference numeral 19 indicates an N-channel diffused layer. Here, reference numeral 15' (including a prime mark) indicates a modified portion.

That is, the distinctive feature of the present embodiment in comparison with the first embodiment (explained using FIGS. 2A and 2B) is to apply the process of step S2 in FIG. 1 to only the second metal wiring layer among the first and second wiring layers.

If the pitch of wiring belonging to the first metal wiring layer in the layout shown in FIG. 4A is enlarged, the spacing of each contact, that is, the size of a relevant semiconductor chip, may be increased. In this case, the size of the semiconductor device is also increased and the manufacturing cost of the semiconductor device may be increased.

In consideration of this situation, in the present embodiment, the second metal wiring layer is chosen for applying the present invention because the pitch of the second metal wiring can be enlarged without increasing the chip size of the semiconductor chip. Therefore, the wiring pitch of only the second metal wiring layer is enlarged by applying the process of step S2 in the flowchart of FIG. 1, thereby obtaining the layout shown in FIG. 4B.

In this way, the design rules applied to the mask and manufacturing process of the second metal wiring layer are relaxed, thereby reducing the manufacturing cost of the semiconductor device.

As explained above, in the present embodiment, the second metal wiring layer, whose wiring pitch can be enlarged without increasing the size of the semiconductor chip, is selected, and the relevant wiring pitch is enlarged; thus, the manufacturing cost of the semiconductor device can be effectively reduced in comparison with the first embodiment.

In addition, the size of each semiconductor chip and the size of the semiconductor device are not increased; therefore, the operational delay of the semiconductor device is not increased by the final layout of the semiconductor device.

Additionally, in the present embodiment, a wiring layer is selected under the condition that the wiring pitch can be enlarged without increasing the size of the semiconductor chip, and the wiring pitch of only the selected wiring layer is enlarged. However, in the present invention, a wiring layer may be selected under a relaxed condition, such that the wiring pitch can be enlarged without increasing the size of the semiconductor chip by more than 2 $\mu$m (that is, an increase of the chip size by 2 $\mu$m or less is allowable), and the wiring pitch of only the selected wiring layer is enlarged.

What is claimed is:

1. A method of designing a semiconductor device which includes at least semiconductor chips and wiring layers for connecting the semiconductor chips, comprising the step of:
   determining a maximum pitch of wiring of the wiring layers under a condition that power consumption the semiconductor chips at a predetermined operating frequency is equal to or less than a predetermined value.

2. A method of designing a semiconductor device, as claimed in claim 1, further comprising the step of:
   determining the width and spacing of wiring of the wiring layers and the width of each contact for mounting the semiconductor chips, based on the determined pitch of wiring of the wiring layers.

3. A method of designing a semiconductor device, as claimed in claim 1, further comprising the step of:
   selecting one or more of the wiring layers under a predetermined condition, and wherein:
      in the step of determining a maximum pitch of wiring of the wiring layers, the pitch of wiring of only the selected wiring layers is maximized under the condition that power consumption of the semiconductor chips at a predetermined operating frequency is equal to or less than a predetermined value.

4. A method of designing a semiconductor device, as claimed in claim 2, further comprising the step of:
   selecting one or more of the wiring layers under a predetermined condition, and wherein:
      in the step of determining a maximum pitch of wiring of the wiring layers, the pitch of wiring of only the selected wiring layers is maximized under the condition that power consumption of the semiconductor chips at a predetermined operating frequency is equal to or less than a predetermined value.

5. A method of manufacturing a semiconductor device which includes at least semiconductor chips and wiring layers for connecting the semiconductor chips, comprising the steps of:
   determining a maximum pitch of wiring of the wiring layers under a condition that power consumption of the semiconductor chips at a predetermined operating frequency is equal to or less than a predetermined value;

determining the width and spacing of wiring of the wiring layers and the width of each contact for mounting the semiconductor chips, based on the determined pitch of wiring of the wiring layers; and manufacturing the semiconductor device by using a mask and a manufacturing process by which the determined pitch and width of wiring are realized.

6. A method of manufacturing a semiconductor device, as claimed in claim 5, further comprising the step of:

selecting one or more of the wiring layers under a predetermined condition, and wherein:

in the step of determining a maximum pitch of wiring of the wiring layers, the pitch of wiring of only the selected wiring layers is maximized under the condition that power consumption of the semiconductor chips at a predetermined operating frequency is equal to or less than a predetermined value.

7. A method of manufacturing a semiconductor device, as claimed in claim 5, further comprising the step of:

selecting a mask and a manufacturing process under a predetermined condition among masks and manufacturing processes for realizing the determined pitch and width of wiring, and wherein:

in the step of manufacturing the semiconductor device, the semiconductor device is manufactured by using the selected mask and manufacturing process.

8. A method of manufacturing a semiconductor device, as claimed in claim 6, further comprising the step of:

selecting a mask and a manufacturing process under a predetermined condition among masks and manufacturing processes for realizing the determined pitch and width of wiring, and wherein:

in the step of manufacturing the semiconductor device, the semiconductor device is manufactured by using the selected mask and manufacturing process.

* * * * *